Figure 1:
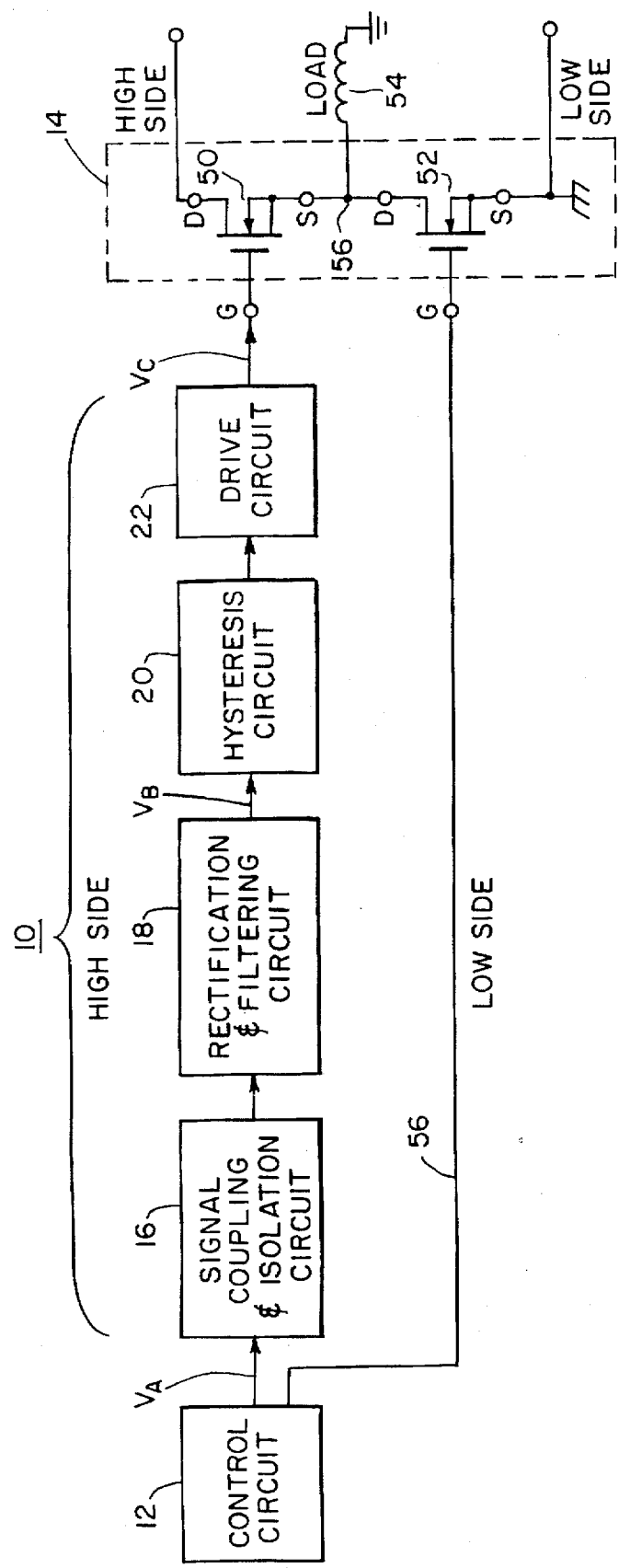

United States Patent [19]
Goel

[11] Patent Number: 5,675,276
[45] Date of Patent: Oct. 7, 1997

[54] GATE DRIVER CIRCUIT AND HYSTERESIS CIRCUIT THEREFOR

[75] Inventor: Rakesh Goel, Roorkee, India

[73] Assignee: Analog Devices, Inc., Norwood, Mass.

[21] Appl. No.: 534,634

[22] Filed: Sep. 27, 1995

[51] Int. Cl.$^6$ ................................................ H03K 3/037
[52] U.S. Cl. ...................................... 327/205; 327/143
[58] Field of Search .............................. 327/102, 104, 327/108, 142, 143, 184, 205, 206

[56] References Cited

U.S. PATENT DOCUMENTS

| | | | |
|---|---|---|---|
| 4,162,435 | 7/1979 | Wright | 318/138 |
| 4,250,544 | 2/1981 | Alley | 364/110 |
| 4,636,936 | 1/1987 | Boyd, Jr. et al. | 364/148 |
| 4,642,536 | 2/1987 | Boyd, Jr. et al. | 318/254 |
| 4,654,566 | 3/1987 | Erdman | 318/254 |
| 4,757,241 | 7/1988 | Young | 318/254 |
| 5,272,398 | 12/1993 | Schroder-Brumloop et al. | 307/571 |
| 5,498,987 | 3/1996 | Nelson | 327/142 |
| 5,523,709 | 6/1996 | Phillips et al. | 327/205 |

*Primary Examiner*—Timothy P. Callahan
*Assistant Examiner*—Jeffrey Zweizig
*Attorney, Agent, or Firm*—Iandiorio & Teska

[57] ABSTRACT

A hysteresis circuit including first and second voltage reference circuits responsive to an input control signal for providing first and second voltage levels connected in series to produce a higher voltage level; a first switching circuit, responsive to the voltage reference circuits to turn on and provide an output drive signal when the higher voltage is reached; a second switching circuit, responsive to the first switching circuit turning on, for removing one of the first and second voltage levels to produce a lower voltage level; the first switching circuit turning off in response to the input level control signal decreasing below the lower voltage level.

2 Claims, 3 Drawing Sheets

GATE DRIVER CIRCUIT AND HYSTERESIS CIRCUIT THEREFOR

FIELD OF INVENTION

This invention relates to an improved gate driver circuit for a power converter, and more particularly to a hysteresis circuit for a gate driver circuit.

BACKGROUND OF INVENTION

Gate drive circuits for power converters generally have a high side and a low side for driving the high and low side power converter devices which are typically MOSFET implemented. The low side MOSFET can be driven directly from the control signal since the gate driver circuit and converter have a common ground. But the high side needs isolation because it floats at a voltage above ground. Typically isolation is accomplished by a transformer followed by a rectifier and filter which reforms the modulated carrier signal to a d.c. level for driving the drive circuit which ultimately drives the power converter. There are a number of shortcomings with conventional gate driver circuits. There is a certain amount of ripple associated with the d.c. level which can be improved by increasing the size of the filter capacitor. But a compromise must be struck between the size of the capacitor and tolerable ripple. An even more troublesome problem occurs as the gate driver circuit turns on the high side power MOSFET and the gate-drain voltage is substantially reduced. This results in current flow through the inherent [parasitic] MOSFET gate-drain capacitance which loads the gate driver circuit and draws the voltage of the control signal below the trigger level and so turns off the power converter. The voltage quickly rises again now that the loading effects are gone and so the power converter is triggered on once again. This continues causing power loss and overheating of the converter. Further since the ripple must be kept as small as possible so that it does not aggravate this rapid switching due to the loading, the filter capacitor must be fairly large. A large capacitor means a slower turn-off and turn-on time when the control signal switches the power converter.

SUMMARY OF INVENTION

It is therefore an object of this invention to provide an improved gate driver circuit for a power converter.

It is a further object of this invention to provide an improved hysteresis circuit for a gate driver circuit.

It is a further object of this invention to provide such a circuit which reduces loading effects and permits the use of a smaller filter capacitance.

It is a further object of this invention to provide such a circuit which has a more rapid turn-off and turn-on.

It is a further object of this invention to provide such a circuit which has a range of MOSFET operating voltages and turns off at a substantially lower voltage than that at which it turns on.

It is a further object of this invention to provide such a circuit which avoids the power loss and overheating caused by unwanted rapid turn-on and turn-off of the converter.

The invention results from the realization that a truly improved gate driver circuit for a power converter can be achieved using a hysteresis circuit which turns off the converter at a substantially lower voltage level than the level at which it tuns on so that rapid unwanted cycles of turn-on and turn-off are avoided and since the lower turn-off level is well below the higher turn-on level the amount of ripple tolerable is much greater so that the filter capacitance size can be reduced resulting in a smaller filter RC constant and faster turn-off and turn-on.

This invention features a hysteresis circuit including first and second voltage reference circuits responsive to an input control signal for providing first and second voltage levels connected in series to produce a higher voltage level. There is a first switching circuit, responsive to the voltage reference circuits to turn on and provide an output drive signal when the higher voltage is reached, and a second switching circuit, responsive to the first switching circuit turning on, for removing one of the first and second voltage levels to produce a lower voltage level. The first switching circuit turns off in response to the input level control signal decreasing below the lower voltage level.

The invention also features a power converter gate driver circuit including a torroidal transformer isolation circuit responsive to an input control signal, a rectifier circuit, responsive to the isolation circuit, for rectifying the control signal, a filter circuit, responsive to the rectifying circuit for filtering the rectified control signal, and a hysteresis circuit, responsive to the filtered, rectified control signal reaching a higher level for producing an output drive signal in response to the filtered, rectified control signal decreasing to a lower level below the higher level for ending the output drive signal and maintaining the output drive signal between the higher and lower levels.

In a preferred embodiment the hysteresis circuit may include first and second voltage reference circuits responsive to an input control signal for providing first and second voltage levels connected in series to produce a higher voltage level, a first switching circuit, responsive to the voltage reference circuits to turn on and provide an output drive signal when the higher voltage is reached, a second switching circuit, responsive to the first switching circuit turning on, for removing one of the first and second voltage levels to produce a lower voltage level; the first switching circuit turning off in response to the input level control signal decreasing below the lower voltage level.

DISCLOSURE OF PREFERRED EMBODIMENT

Figure 2A:
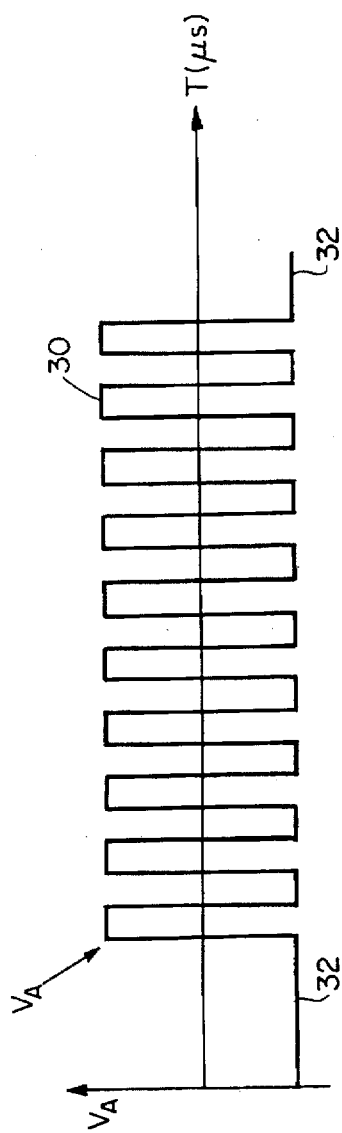

Other objects, features and advantages will occur to those skilled in the art from the following description of a preferred embodiment and the accompanying drawings, in which:

FIG. 1 is a block diagram of a gate driver circuit according to this invention showing the power converter which it serves and the control circuit from which it derives the control signal;

FIGS. 2A, B and C show the waveforms at points A, B and C in FIG. 1; and

Figure 3:
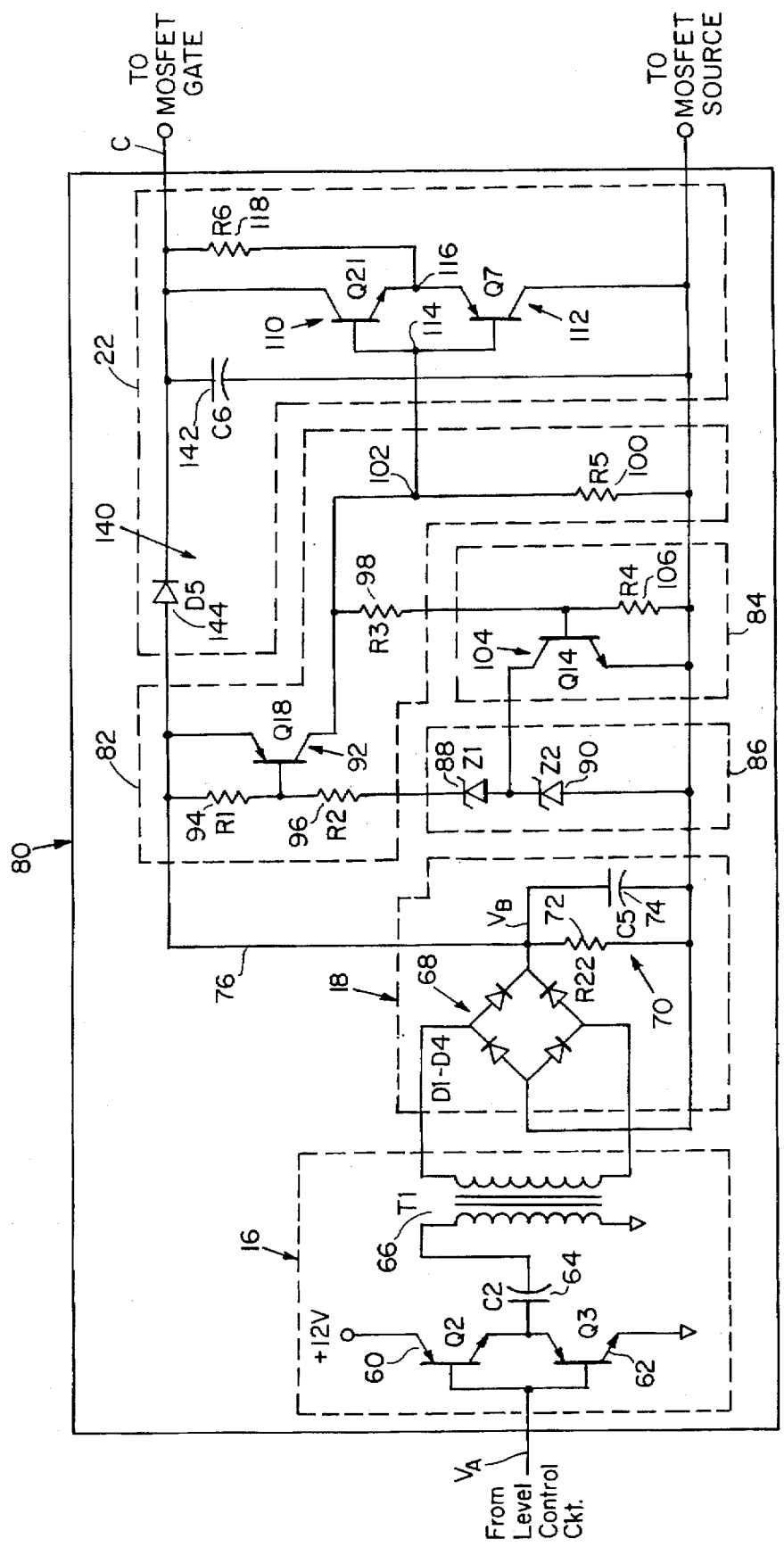

FIG. 3 is a more detailed schematic of the signal coupling and isolation circuit, rectification and filtering circuit, hysteresis circuit and driver circuit of FIG. 1.

There is shown in FIG. 1 a gate driver circuit 10 according to this invention accompanied by control circuit 12 which provides the control signal input to gate driver 10 and power converter 14 which is driven by gate driver circuit 10. Gate driver circuit 10 includes toroidal transformer signal coupling and isolation circuit 16 which amplifies and isolates the incoming signal from control circuit 12. That signal is then rectified and filtered in rectification and filter circuit 18 and submitted to hysteresis circuit 20 whose output drives drive circuit 22 that ultimately operates power converter 14.

Figure 2B:
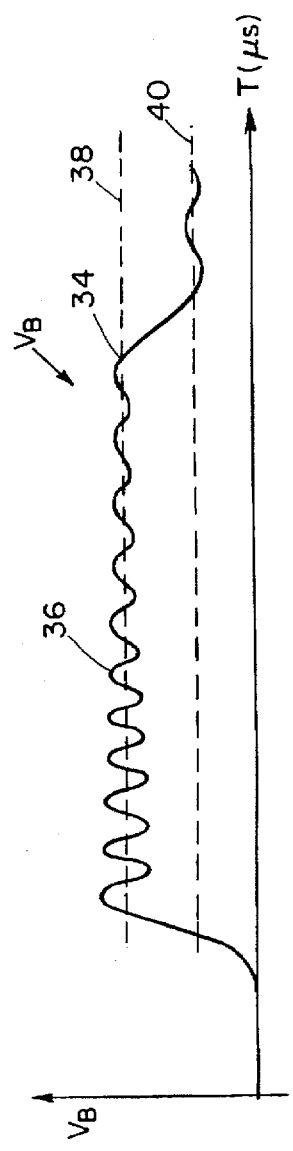
Figure 2C:
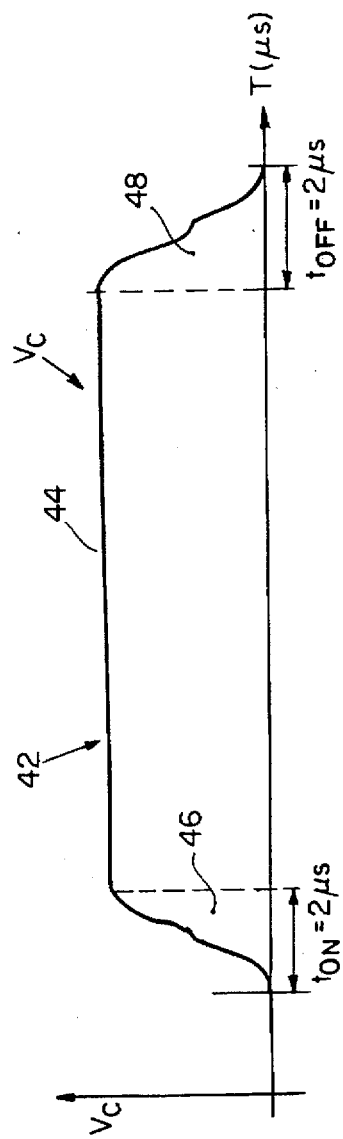

Control circuit 12 provides a modulated carrier signal $V_A$, FIG. 2A, which represents the on condition 30 when modulation carrier $V_A$ is present and an off condition 32 when carrier $V_A$ is not present. After isolation, rectification and filtering, input control signal $V_A$ appears as signal $V_B$ 34, FIG. 2B, as a continuous elevated d.c. level with significant ripple 36. In prior art devices where the power converter was turned on above a trigger level 38 and turned off below that level, it can be seen that the significant ripple 36 will cause the power converter to undesirably turn on and off a number of times during the defined on part of the signal. In addition to interfering with the operation of the circuit it also causes power loss and overheating. To combat this the present invention uses hysteresis circuit 20 which separates the on and the off triggers for the power converter creating a hysteresis effect so that the circuit is triggered on as conventionally at level 38 but will not be triggered off until the much lower level 40. This results in the smoother operation of power converter 14 as indicated by the waveform $V_c$ 42, FIG. 2C, having a smooth, continuous on period 44, bracketed by very fast turn-on 46 and turn-off periods, respectively, of approximately two microseconds. The fast turn on is achieved because the control signal is substantially higher than the voltage required to trigger the MOSFET which results in a very fast charging of the MOSFET gate-source capacitance. Since the turn-off level 40, FIG. 2B, is well spaced from the turn-on level 38, even significant ripple 36 does not cause the undesirable cycling on and off or hunting that occurs in conventional prior art devices. In fact, the ripple tolerated can be increased so that the filter capacitance in rectification and filtering circuit 18 can be made even smaller, thereby decreasing further the turn-on and turn-off periods 46 and 48 of power converter 14.

Power converter 14 may include a pair of MOSFET transistors 50, 52 that have their load electrodes connected to a common point and to the ultimate load 54. Since the low side MOSFET 52 is connected to a common ground with control circuit 12, it can be operated directly on line 56 from control circuit 12. However, since the high side MOSFET 50 is connected to a common point 56, which is floating or subject to variable voltage, it requires the added complexity of gate driver circuit 10.

Signal coupling and isolation circuit 16, FIG. 3, includes a signal enhancer or amplifier including transistors 60 and 62 having a common emitter output connected through coupling capacitor 64 to isolation transformer 66. The secondary isolation transformer 66 is delivered to full wave bridge rectifier 68 in rectification and filtering circuit 18. The output from rectifier 68 is filtered by RC filter 70 which includes resistance 72 and capacitance 74. The output $V_B$ from rectification and filtering circuit 18 is delivered on line 76 to hysteresis circuit 80 which includes first and second switching circuits 82 and 84 and a reference device 86. Reference device 86 includes first and second voltage reference circuits 88 and 90 which are implemented as shown by Zener diodes having breakdown voltages of 6.3 volts and 4.7 volts, respectively, so that when both Zener diodes 88 and 90 are in the circuit the total breakdown voltage is 11 volts.

First switching circuit 82 includes transistor 92 whose base is biased by the voltage divider network consisting of resistors 94 and 96 connected in series between line 76 and reference device 86. First switching circuit 82 also includes resistances 98 and 100 at the junction 102 of which the output is provided to drive circuit 22. Second switching circuit 84 includes transistor 104 and a resistance 106 connected to the base of transistor 104 in series with resistor 98 in first switching circuit 82. The collector of transistor 104 is connected directly to the junction between Zener diodes 88 and 90. Drive circuit 22 includes a pair of transistors 110, 112 whose bases are connected in common at terminal 114 electrically connected to terminal 102. The output from drive circuit 22 is taken from the common connection 116 between transistors 110 and 112 and is interconnected to the gate of the power converter MOSFET 50, FIG. 1, through resistance 118, FIG. 3.

In operation, a signal $V_A$, FIG. 2A, applied at the input of signal coupling and isolation circuit 16, FIG. 3, is amplified by transistors 60 and 62 and delivered to isolation transformer 66, then rectified in rectifier 68 and filtered by filter 70 to provide the output $V_B$, FIG. 2B. $V_B$ is provided on line 76, FIG. 3, to first switching circuit 82 in hysteresis circuit 80. When the voltage $V_B$ goes above 11 volts (the upper voltage level determined by Zener diodes 88 and 90 being connected together in series), the voltage at the base of transistor 92 is decreased sufficiently so that transistor 92 conducts and provides an output signal on terminal 102, and thus also on terminal 114 to operate drive circuit 22. At the same time this turning on of transistor 92 provides the output signal at terminal 114, it also turns on transistor 104 causing transistor 104 to conduct and short out Zener diode 90 thereby dropping the voltage by 11.0 volts to 6.3 volts. This means that the input voltage $V_A$ and thus the rectified filtered voltage $V_B$ can go as low as 6.3 volts approximately before transistor 92 would be turned off. This wide range between the triggering on and triggering off allows a large ripple to be tolerated and overcomes the problem of the loading effects that occur when power converter 14 is turned on. When the voltage actually drops below 6.3 volts, for example when $V_A$ drops to level 32, FIG. 2A, then transistor 92 will be turned off, the signal to terminal 114 will stop, and transistor 104 will be turned off, reintroducing Zener 90 in series with Zener diode 88.

An added advantage of gate driver 10 is provided by charge pump 140, FIG. 3, which forms a part of gate driver circuit 22. During operation, capacitor 142 charges through diode 144. Thus when the circuit provides a signal on terminal 114, capacitor 142 is ready to discharge through conducting transistor 110 and resistance 118 to provide the MOSFET gate capacitance charging current to rapidly turn on MOSFET 50 in power converter 14. The addition of diode 144 means that capacitor 142 does not slow down the operation of filter 70 at turn off. When switching circuits 92 and 104 are turned off the voltage at the base of transistor 112 goes to zero and so the voltage stored on the gate of MOSFET 50, FIG. 1, will turn on transistor 112, thus discharging the gate capacitor's voltage through resistance 118 and this assists in the rapid turn-off of the power MOSFET 50.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. The hysteresis circuit comprising:

first and second voltage reference circuits responsive to an input control signal for providing first and second voltage levels connected in series to produce a higher voltage level;

a first switching circuit, responsive to said voltage reference circuits, to turn on and provide an output drive signal when said higher voltage is reached;

a second switching circuit, responsive to said first switching circuit turning on, for removing one of said first and second voltage levels to produce a lower voltage level.

2. A power converter gate driver circuit comprising:

an isolation circuit, responsive to an input control signal;

a rectifier circuit, responsive to said isolation circuit, for rectifying said control signal;

a filter circuit, responsive to said rectifying circuit for filtering the rectified control signal; and a hysteresis circuit, responsive to the filtered, rectified control signal reaching a higher level for producing an output drive signal and in response to the filtered rectified control signal decreasing to a lower level below said higher level for ending said output drive signal and maintaining said output drive signal between said higher and lower levels;

wherein said hysteresis circuit includes:

first and second voltage reference circuits responsive to an input control signal for providing first and second voltage levels connected in series to produce a higher voltage level;

a first switching circuit, responsive to said voltage reference circuits, to turn on and provide an output drive signal when said higher voltage is reached;

a second switching circuit, responsive to said first switching circuit turning on, for removing one of said first and second voltage levels to produce a lower voltage level.

* * * * *